(12) United States Patent
Kondo et al.

(10) Patent No.: US 7,504,191 B2
(45) Date of Patent: Mar. 17, 2009

(54) PHOTOSENSITIVE RESIN COMPOSITION AND METHOD FOR THE FORMATION OF A RESIN PATTERN USING THE COMPOSITION

(75) Inventors: Masaki Kondo, Toyosaka (JP); Takashi Kanda, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 658 days.

(21) Appl. No.: 10/768,859

(22) Filed: Jan. 30, 2004

(65) Prior Publication Data
US 2004/0224252 A1 Nov. 11, 2004

(30) Foreign Application Priority Data
Jan. 31, 2003 (JP) ............... 2003-024257

(51) Int. Cl.
G03F 7/00 (2006.01)
G03F 7/004 (2006.01)
(52) U.S. Cl. ............... 430/270.1; 430/311; 430/280.1
(58) Field of Classification Search .............. 430/270.1, 430/311
See application file for complete search history.

(56) References Cited

U.S. PATENT DOCUMENTS

| 3,846,345 | A | * | 11/1974 | Mason et al. ............... 252/514 |
| 4,151,313 | A | * | 4/1979 | Wajima et al. ................ 216/12 |
| 4,264,748 | A | * | 4/1981 | Oriel et al. .................. 525/109 |
| 4,378,277 | A | * | 3/1983 | Smith ...................... 156/275.5 |
| 4,394,403 | A | * | 7/1983 | Smith .......................... 427/500 |
| 4,668,736 | A | * | 5/1987 | Robins et al. ................. 525/65 |
| 5,158,860 | A | * | 10/1992 | Gulla et al. ................. 430/315 |
| 5,312,715 | A | | 5/1994 | Daniels et al. |
| 5,506,091 | A | * | 4/1996 | Suzuki et al. ............... 430/324 |
| 5,685,898 | A | * | 11/1997 | Dupuis et al. .............. 106/1.11 |
| 6,174,647 | B1 | * | 1/2001 | Cahalen et al. ............. 430/315 |
| 6,197,408 | B1 | * | 3/2001 | Kanbara et al. ............. 428/209 |
| 6,440,576 | B1 | * | 8/2002 | Yamamoto et al. ........ 428/473.5 |
| 6,579,664 | B2 | * | 6/2003 | Hu et al. ................... 430/284.1 |
| 6,635,410 | B2 | * | 10/2003 | Haussmann et al. ......... 430/313 |
| 2003/0113452 | A1 | * | 6/2003 | Joshi .......................... 427/304 |
| 2005/0022692 | A1 | * | 2/2005 | Eu et al. ..................... 106/1.11 |
| 2005/0025960 | A1 | * | 2/2005 | Levey et al. ................ 428/336 |

* cited by examiner

*Primary Examiner*—Amanda C. Walke
(74) *Attorney, Agent, or Firm*—Jonathan D. Baskin

(57) ABSTRACT

A photosensitive resin composition and a method for the formation of a resin pattern using the photosensitive resin composition are provided. The photosensitive resin composition contains, as a catalyst precursor, a catalytic metal element with a metal-deposition catalytic activity suitable for electroless metal plating. The method for the formation of a resin pattern uses a photosensitive resin composition, which contains, as a catalyst precursor, a catalytic metal element with a metal-deposition catalytic activity suitable for electroless metal plating. By using the method of this invention, it is possible to form a conductive film selectively on a resin pattern formed through exposure and development of the photosensitive resin composition of this invention.

15 Claims, 2 Drawing Sheets

PHOTOSENSITIVE RESIN COMPOSITION AND METHOD FOR THE FORMATION OF A RESIN PATTERN USING THE COMPOSITION

BACKGROUND OF THE INVENTION

This invention is related to a photosensitive resin composition containing, as a catalyst precursor, a catalytic metal element with a metal-deposition catalytic activity suitable for electroless metal plating. In particular, this invention is related to a resin pattern with a metal-deposition catalytic activity suitable for electroless metal plating and to a method for the formation of the resin pattern. This invention is further related to a metal-resin composite prepared through an electroless metal plating treatment on the resin pattern with a metal-deposition catalytic activity suitable for electroless metal plating described above and a method for the formation of the metal-resin composite.

Currently, electroless metal plating treatment is used to form a conductive coating film on an insulating object. The electroless metal plating treatment is carried out through a procedure consisting of the following steps. A conditioning step is carried out using various surfactants to clean the surface and make the surface carry charges. A catalyst-coating step is carried out using a tin/palladium colloid bath. An activation step is carried out using hydrofluoric acid, etc., to activate the catalyst colloid adsorbed on the surface. Electroless metal plating is carried out using a plating bath containing a reducing agent, such as formalin, etc. When the substrate for the electroless metal plating treatment is a printed circuit board for example, carrying a pattern, the pattern can be formed with various methods, such as, but not limited to, the subtractive method, semiadditive method, and full-additive method.

Other methods, such as primer treatment using palladium or silver catalyst, etc., may also be used. In the primer treatment, a metal catalyst is introduced into a resin material containing solvent and inorganic filler. The resin material is coated onto a substrate to form a resin film containing a catalyst. Then, electroless metal plating is carried out to form a conductive film. The primer treatment is mainly used on a plastic surface for the purpose of electromagnetic interference (EMI) shielding.

In the semiconductor field, sputtering and chemical vapor deposition (CVD) are more commonly used for the formation of a conductive layer and the manufacturing technology has been established.

Moreover, a technology of introducing an organic metal salt, etc. with catalytic activity into a resin material and then forming a conducting film with the resin material is disclosed in U.S. Pat. No. 5,059,242 and has been used in the process of electrode formation.

In the current electroless metal plating process, the insulating resin material in the printed circuit board and semiconductor device is first treated with dry etching or using an agent, such as permanganic acid, etc., to generate a rough surface and improve wettability. Then, electroless copper plating or electroless nickel plating is conducted to form a conducting layer on the surface of the resin material.

However, it is very difficult to introduce a carboxyl group or a hydroxyl group to the resin matrix of a highly reliable insulating resin material. In fact, the carboxyl group or hydroxyl group may reduce the reliability of insulating resin material. As a result, the conducting layer formed through electroless metal plating has low adhesion strength to the surface of the insulating resin material. Moreover, for the materials not suitable for generating these anchoring groups, such as glass, ceramic, etc., to improve the attachment of a metal conductive layer, the metal conductive layer formed through electroless metal plating will also have low adhesive strength to the surface. The current electroless metal plating process consists of a series of complicated steps, including conditioning step, catalyst-coating step, activation step, and electroless metal plating step. In order to achieve stable production of high-quality products, it is necessary to have constant monitoring and management of all agents used in each step.

In the process of forming a conductive layer on a base material, currently the surface of the base material is first treated with oxygen plasma and then the conductive layer is formed with sputtering. Moreover, a conductive layer with the required thickness that can be formed by this method by further electrolytic metal plating. However, although sputtering is a standard method for the formation of a thin layer, the process of sputtering usually takes a long period of time and the metal target is expensive. Therefore, the cost of the sputtering process is relatively high.

On the other hand, the method for the formation of a conductive layer with an organic metal salt uses a resinate compound of palladium, silver, platinum, etc. The compound is dissolved in water or an organic solvent and the substrate to be coated is dipped into the solution to form a coating layer of the resinate compound. Then, thermal decomposition of the resinate compound generates a metal thin layer on the substrate to be coated. Finally, electroless or electrolytic metal plating is carried out to form a conductive layer. By using this method, however, the metal coating layer obtained has poor uniformity. In fact, the metal powder is simply attached to the surface of the substrate to be coated and the attachment is not very strong. In order to solve the problem, a paste is prepared by introducing the metal resinate into a synthetic resin material, which is then coated on the substrate to form a uniform coating layer. The paste is widely used to fill holes on printed circuit boards and form electrodes on LCD through screen printing.

However, the conducting paste is not suitable for semiconductors and semiconductor packages as well as other purposes requiring a high reliability. Moreover, it is very difficult to form fine lines through screen printing of the paste. In other words, when using an organic metal salt in the formation of electronic devices, a paste is first prepared by introducing an organic metal salt to a synthetic resin material and then coated on a substrate through screen printing, followed by sintering to convert the organic metal salt to the corresponding metal. In this process, the sintering temperature must be higher than the thermal decomposition temperature of the organic metal salt (at least 300° C.) to remove the synthetic resin material. Therefore, when the synthetic resin material is completely removed, only the metal pattern remains. However, when the method is used in the formation of semiconductor packages, since the base body of semiconductor packages is made of a composite material of epoxy resin reinforced with glass fiber, the high temperature used in the sintering step will cause thermal damage, such as deformation, cracks, etc., on the base body. In addition, since the synthetic resin material is completely removed in the sintering step, various defects, such as pinholes, wire breakage, etc., may be generated in the metal pattern obtained after sintering. In order to avoid these problems, a paste with a high metal content can be used. More specifically, when using a paste containing a gold resinate to form a gold wire, the gold content in the paste must be as high as 25 weight % and the sintering temperature is about 500° C. In other words, the sintering step in the current coating method will cause severe damage to the substrate to be coated. In order to form a metal pattern with a high reliability, the content of the expensive metal in the paste must be increased significantly, resulting in high production costs.

SUMMARY OF THE INVENTION

The purpose of this invention is to solve the problems mentioned above and to provide a photosensitive resin composition, characterized by containing, as a catalyst precursor, an organic compound which contains a catalytic metal element with a metal-deposition catalytic activity suitable for electroless metal plating and a method for the formation of a conducting layer selectively on a resin pattern by coating the resin composition on a substrate, followed by exposure and development. In this invention, an etching process is not needed in the formation of a conductive pattern on a substrate. By using the method of this invention, a conductive layer with a high adhesive strength, which is similar to the adhesive strength obtained through sputtering, can be obtained at a low cost through large-scale production. Compared to the current electroless metal plating process, the method of this invention is very simple and does not require complicated monitoring and management of all agents. In addition, the method of this invention does not require a pilot line and the coating layer can be formed on the substrate through a stable process suitable for large-scale production. The method of this invention is characterized by having the capability of forming a metal-resin composite carrying fine metal wires compared to the current semiadditive method and subtractive method. Finally, the metal-resin composite formed with the method of this invention is different from the metal-resin composite formed with the method using a paste containing an organic metal salt. The substrate has little thermal damage caused by the sintering process and the metal conducting layer formed through electroless metal plating is very uniform and has almost no defects, such as pin holes, etc.

The method of this invention can be used for large-scale and low-cost production of metal-resin composites, with a high attachment strength between the metal layer and resin substrate and is suitable for applications requiring high reliability, such as semiconductors, semiconductor packages, etc.

This invention concerns a photosensitive resin composition, characterized by containing, as a catalyst precursor, an organic compound that contains a catalytic metal element with a metal-deposition catalytic activity suitable for electroless metal plating.

This invention also concerns a method for the formation of a resin pattern with a metal-deposition catalytic activity suitable for electroless metal plating, characterized by using the following procedure. Thus, the photosensitive resin composition described above is first coated on a substrate and then exposed and developed to form a resist pattern. Next, a conversion treatment is conducted to convert the catalyst precursor present in the resin pattern to a catalyst, followed by activation of the resin pattern surface.

This invention further concerns a resin pattern with a metal-deposition catalytic activity suitable for electroless metal plating formed with the method described above.

This invention still further concerns a method for the formation of a metal-resin composite, characterized by using an electroless metal plating treatment of the resin pattern with a metal-deposition catalytic activity suitable for electroless metal plating described above by depositing a metal on the resin pattern.

This invention yet further concerns a metal-resin composite formed with the method for the formation of a metal-resin composite described above.

DESCRIPTION OF THE DRAWINGS

FIG. 1 is an SEM picture showing the surface of the resin pattern formed by the photosensitive resin composition of this invention after the plasma etching treatment.

FIG. 2 is an SEM picture showing the surface of the resin pattern formed by a photosensitive resin composition containing no catalyst precursor after the plasma etching treatment.

DETAILED DESCRIPTION OF THE INVENTION

Figure 1:
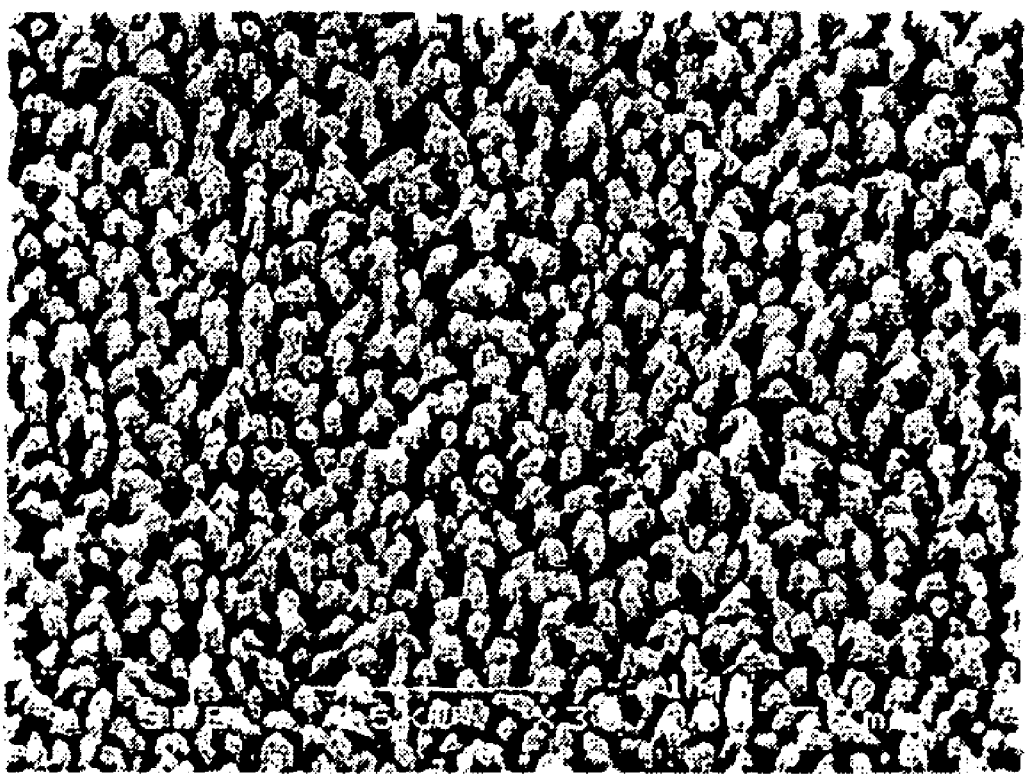
FIG. 1.

The photosensitive resin composition of this invention contains, as a catalyst precursor, an organic compound that contains a catalytic metal element with a metal-deposition catalytic activity suitable for electroless metal plating.

The electroless metal plating treatment used in this invention can be any commonly used electroless metal plating treatment for depositing a metal selected from copper, nickel, gold, tin, zinc, silver, and cobalt as well as an alloy of these metals. In this invention, there is no special limitation on the metal, plating bath, and plating conditions used in the electroless metal plating treatment.

The catalytic metal element used in this invention should be determined based on the electroless metal plating treatment. Any metal element can be used for the purpose as long as the metal element is able to show a catalytic activity of metal deposition suitable for electroless metal plating. Examples of the catalytic metal element includes, without limitation, palladium, silver, platinum, rhodium, indium, and ruthenium. In consideration of production cost and sintering temperature, it is preferable to use palladium or rhodium as the catalytic metal element for electroless metal plating of copper, nickel, or nickel alloy.

In this invention, the catalyst precursor itself has no catalytic activity of metal deposition suitable for electroless metal plating and is only an organic compound containing a catalytic metal element and capable of being converted to a catalyst, which has the catalytic activity in metal deposition suitable for electroless metal plating, after the conversion treatment. The photosensitive resin composition of this invention may contain one catalyst precursor or multiple types of catalyst precursors.

There is no special limitation on the organic compound forming the catalyst precursor, as long as the use of the organic compound will not affect the results of this invention. As the catalyst precursor, however, it is preferable to use a metal salt of an alkyl, alkenyl, or alkynyl carboxylic acid. The alkyl, alkenyl, or alkynyl carboxylic acid can be either a straight-chain or a branched carboxylic acid and may or may not carry a substituent group. The potential substituent group can be, for example, carboxyl group, hydroxyl group, sulfonyl group, mercapto group, cyano group, halogen atom, etc. However, it is preferable to use an alkyl, alkenyl, or alkynyl carboxylic acid carrying no substituent group.

As a part of the catalyst precursor, the alkyl, alkenyl, or alkynyl carboxylic acid can be, for example, a ($C_1$-$C_{30}$) alkyl, a ($C_2$-$C_{30}$) alkenyl, or a ($C_2$-$C_{30}$) alkynyl carboxylic acid, respectively. Preferably, the alkyl, alkenyl, or alkynyl carboxylic acid is a ($C_3$-$C_{18}$) alkyl, a ($C_3$-$C_{18}$) alkenyl, or a ($C_3$-$C_{18}$) alkynyl carboxylic acid, respectively. More preferably, the alkyl, alkenyl, or alkynyl carboxylic acid is a ($C_6$-$C_{14}$) alkyl, a ($C_6$-$C_{14}$) alkenyl, or a ($C_6$-$C_{14}$) alkynyl carboxylic acid, respectively. Most preferably, the alkyl, alkenyl, or alkynyl carboxylic acid is a ($C_8$-$C_{10}$) alkyl, a ($C_8$-$C_{10}$) alkenyl, or a ($C_8$-$C_{10}$) alkynyl carboxylic acid, respectively.

When the catalyst precursor is a metal salt of an alkyl, alkenyl, or alkynyl carboxylic acid, either simple salt or complex salt as well as a combination of simple salt and complex salt can be used for the purpose.

In this invention, the catalyst precursor can be prepared with any common method, as long as the catalyst precursor can be present in the photosensitive resin composition as an organic compound containing a catalytic metal element. For example, the organic compound can be added to a photosensitive resin composition to form the photosensitive resin composition of this invention. Also, the catalytic metal element and the other part of the catalyst precursor can be added separately to a photosensitive resin composition, so that the catalyst precursor can be formed in the photosensitive resin composition. The catalyst precursor can be a commercially available product as long as the product contains the compound described above. For example, the palladium resinate manufactured by Heraeus Co., such as MR-4602P (containing palladium neodecanate, decomposition 209° C., brown oil), and the palladium resinate manufactured by Degussa Co., such as Pd-C8 (containing palladium neooctanate, decomposition 200.1° C., dark red oil), Pd-C10 (palladium neodecanate, decomposition 208° C., brown oil), are suitable for this purpose.

The content of the catalyst precursor in the photosensitive resin composition of this invention should be sufficient to catalyze the metal deposition on the resin pattern during the electroless metal plating after the formation of the resin pattern and is selected based on the conditions used in electroless metal plating, the composition of the photosensitive resin composition, as well as the size and shape of the resin pattern. Usually, the content of the catalyst precursor should be in the range of 0.001-70 weight %, preferably 0.01-10 weight %, and more preferably 0.1-1 weight %.

The temperature for the conversion of the catalyst precursor to the catalyst depends, for example, on the type of the catalytic metal element and the alkyl, alkenyl, or alkynyl carboxylic acid part forming the catalyst precursor and should be in the range of 170° C. or higher, preferably 190° C. or higher, and more preferably 200° C. or higher. The upper limit of the temperature used for the conversion depends on the type of the catalyst precursor, the resin material, the type of the substrate, and should be in the range of 10° C., and preferably 5° C., higher than the decomposition temperature of the catalyst precursor.

In this invention, there is no special limitation on the photosensitive resin composition, as long as the photosensitive resin composition is able to respond under irradiation with a radiation beam, such as UV light, far infrared beam, electron beam, X-ray beam, etc., to form a resin pattern. Either negative type or positive type photosensitive resin composition is suitable for the purpose. For example, single-component, binary, or ternary negative type photosensitive resin composition as well as single-component, binary, or ternary positive-type photosensitive resin composition can be used.

The single-component positive-type photosensitive resin composition can be, for example, a photosensitive resin composition which contains a polymer with a main chain cleavable under irradiation with a high-energy radiation beam to form a positive-type image after development. Good examples of the single component positive-type photosensitive resin composition include, without limitation, photosensitive resin compositions containing poly(methyl methacrylate) and its derivative polymers, poly(hexafluorobutyl methacrylate), poly(trifluoroethyl α-chloroacrylate), polyolefinsulfone, PBS, nitrocellulose, and polymethylisopropylketone. The binary positive-type photosensitive resin composition can be, for example, a photosensitive resin composition which contains a resin such as novolac resin and a dissolution inhibitor such as diazonaphthoquinone, a photosensitive resin composition which contains a resin and poly (2-methylpentenesulfone) or its derivatives as a dissolution inhibitor for novolac resin, or a photosensitive resin composition, which contains a resin and an onium salt as an acid-generating agent to promote decomposition of poly(t-Boc styrene), polyphthalaldehyde, polycarbonate, etc. The ternary positive-type photosensitive resin composition can be, for example, a photosensitive resin composition which contains a resin, such as novolac resin, etc., a dissolution inhibitor, and an acid-generating agent.

The single component negative-type photosensitive resin composition can be, for example, a photosensitive resin composition, which contains a polymer resin, such as but not limited to chloromethylated polystyrene, chlorinated polymethylstyrene, poly(p-chlorostyrene), and chloromethylated poly(2-isopropenylnaphthalene). The binary negative type photosensitive resin composition can be, for example, a photosensitive resin composition which contains cyclized rubber resin and a bisdiazide crosslinking agent, a photosensitive resin composition which contains polyepoxide and an onium salt, a photosensitive resin composition which contains poly (vinylphenol) and a bisdiazide crosslinking agent, a photosensitive resin composition which contains polyphosphazine and $CBr_4$, etc. The ternary negative-type photosensitive resin composition can be, for example, a photosensitive resin composition which contains a resin such as novolac resin, a crosslinking agent, and an acid-generating agent.

Preferably, the negative-type photosensitive resin composition contains an epoxy compound and a resin material selected from poly(vinylphenol), novolac resin and a combination of the two resins. More preferably, the negative type photosensitive resin composition further contains a phenol-biphenylene resin.

In this invention, the epoxy compound is an organic compound carrying one or more oxirane rings capable of ring-opening polymerization. The compound is widely known as an epoxide, including aliphatic, alicyclic aromatic, and heterocyclic epoxide present as a monomer, oligomer, or polymer. Preferably, the compound is an epoxide carrying 2 or more polymerizable epoxy groups per molecule. A polymeric epoxide can be, for example, a linear polymer carrying terminal epoxy groups such as polyoxyalkylene glycol diglycidyl ether, a polymer containing an oxirane unit in the main polymer chain such as polybutadiene polyepoxide, or a polymer containing an epoxy group in the side chain of the polymer such as polymer or oligomer of diglycidyl methacrylate. The epoxide can be either a pure compound or a mixture containing one or two or more epoxy groups per molecule.

The epoxy compound can be, for example, a low molecular weight monomer, an oligomer, or a high molecular weight polymer, which may have various main chains and carry various substituent groups. For example, the main chain can be any type of polymer chain, while the substituent group can be a group capable of being connected to an oxirane unit. Good examples of the substituent group are halogen atom, ester group, ether group, sulfonate group, siloxane group, nitro group, phosphate group, etc.

Preferably, the epoxy compound of this invention is a glycidyl ether, including a polyvalent phenol glycidyl ether prepared through the reaction of a polyvalent phenol with excess chlorohydrin or epichlorohydrin, such as diglycidyl ether of 2,2-bis(2,3-epoxy-propoxyphenol)propane. More preferably, the epoxy compound of this invention is a bisphenol A type epoxy compound prepared through the reaction of bisphenol A with epichlorohydrin. More preferably, the epoxy compound of this invention is the compound represented by the following general formula (I)

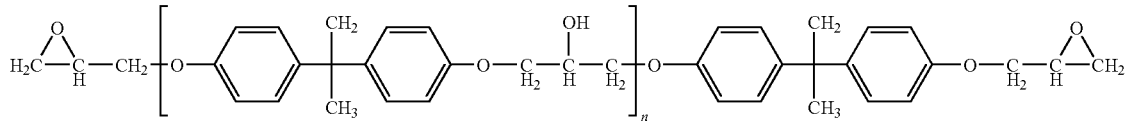

wherein n=0-2, preferably n=0-1, and more preferably n=0.

Specific examples of the epoxy compound are described in U.S. Pat. No. 3,018,262. Most epoxy compounds used in this invention are commercially available. For example, commercially available epoxides are epichlorohydrin, glycidol, glycidyl methacrylate, p-tert-butylphenol glycidyl ether, such as Epi-Rez 5014 (trade name, Celanese Co.), bisphenol A diglycidyl ethers, such as Epon 828, Epon 1004, Epon 1010 (trade name, Shell Chemical Co.), and DER-331, DER-332, DER-334 (trade name, Dow Chemical Co.), vinylcyclohexene dioxide, such as ERL-4206 (trade name, Union Carbide Corp.), 3,4-epoxy-6-methyl-cyclohexylmethyl 3,4-epoxy-6-methylcyclohexenecarboxylate, such as ERL-4201 (trade name, Union Carbide Corp.), bis(3,4-epoxy-6-methyl-cyclohexylmethyl) adipate, such as ERL-4289 (trade name, Union Carbide Corp.), bis(2,3-epoxycyclopentyl) ether, such as ERL-0400 (trade name, Union Carbide Corp.), polypropylene-glycol-modified aliphatic epoxide, such as ERL-4050 and ERL-4269 (trade name, Union Carbide Corp.), dipentene dioxide, such as ERL-4269 (trade name, Union Carbide Corp.), brominated bisphenol type epoxy resin, such as DER-580 (trade name, Dow Chemical Co.), 1,4-butanediol diglycidyl ether/phenol formaldehyde novolac, such as DEN-431 and DEN-438 (trade name, Dow Chemical Co.), and resorcinol diglycidyl ether, such as Kopoxite (trade name, Koppers Company, Inc.).

In the negative-type photosensitive resin composition of this invention, the poly(vinylphenol) is preferably poly(p-vinylphenol). The poly(p-vinylphenol) used in this invention is a polymer consisting of p-vinylphenol as the polymerization unit. There is no special limitation on the polymer as long as it carries no epoxy group. Preferably, the polymer contains 50 weight % or more p-vinylphenol as the polymerization unit. More preferably, the polymer contains 75 weight % or more p-vinylphenol as the polymerization unit. Still more preferably, the polymer contains 90 weight % or more p-vinylphenol as the polymerization unit. Most preferably, the polymer contains only p-vinylphenol as the polymerization unit and is a homopolymer of p-vinylphenol. In this invention, the weight-average molecular weight of the poly(p-vinylphenol) should be in the range of 2000-40000, and preferably 5000-35000.

In the poly(p-vinylphenol), the polymerization unit other than p-vinylphenol can be formed by any compound copolymerizable with p-vinylphenol, as long as the use of the compound will not affect the results of this invention. Exemplary compounds include esters of acrylic acid or methacrylic acid, such as methyl acrylate, methyl methacrylate, hydroxyethyl acrylate, butyl methacrylate, octyl acrylate, 2-ethoxyethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, 2,2-di(p-hydroxyphenyl)propane dimethacrylate, triethylene glycol diacrylate, polyoxyethyl-2,2-di(p-hydroxyphenyl) propane dimethacrylate, triethylene glycol dimethacrylate, polyoxypropyl trimethylolpropane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenylethylene 1,2-dimethacrylate, pentaerythritol tetramethacrylate, trimethylolpropane trimethacrylate, 1,5-pentanediol dimethacrylate, and 1,4-benzenediol dimethacrylate, styrene derivatives such as styrene, 2-methylstyrene, and vinyltoluene, vinyl esters, such as vinyl acrylate, and vinyl methacrylate, and vinylphenols such as o-vinylphenol, and m-vinylphenol. However, these examples should not be considered as limitations of this invention.

The poly(p-vinylphenol) can be prepared with a common method. Commercially available products, such as Marcalinker M S4P (trade name, Maruzen Sekiyu Co.), may also be used.

The novolac resin is a thermoplastic condensation product formed by phenol and aldehyde. In this invention, the novolac resin should not contain the phenol-biphenylene resin described below and should not carry an epoxy group. The weight-average molecular weight of the novolac resin should be in the range of 2000-60000, and preferably 5000-40000.

The novolac resin can be prepared through polycondensation reaction of at least one aromatic hydrocarbon selected from, but not limited to, m-cresol, o-cresol, p-cresol, 2,5-xylenol, 3,5-xylenol, resorcinol, pyrogallol, bisphenol, bisphenol A, trisphenol, o-ethylphenol, m-ethylphenol, p-ethylphenol, propylphenol, n-butylphenol, t-butylphenol, 1-naphthol, and 2-naphthol, with at least one aldehyde or ketone selected from, but not limited to, formaldehyde, acetaldehyde, propionaldehyde, benzaldehyde, furfural, acetone, methyl ethyl ketone, and methyl isobutyl ketone, in the presence of an acid. In this case, paraformaldehyde and paracetaldehyde can be used to replace formaldehyde and acetaldehyde, respectively. Preferably, the novolac resin is prepared through polycondensation reaction of at least one phenol selected from o-cresol, m-cresol, p-cresol, 2,5-xylenol, 3,5-xylenol, and resorcinol with at least one aldehyde selected from formaldehyde, acetaldehyde, and propionaldehyde, in the presence of an acid.

In this invention, the phenol-biphenylene resin is a polymer including of a phenol and biphenylene repeating unit. In addition to the phenol and biphenylene repeating unit, the polymer may also include an alkylene repeating unit, such as methylene, and ethylene. Moreover, the phenol and biphenylene repeating unit may also carry a substituent group, such as an alkyl group, and alkoxy group, as long as the substituent group will not affect the results of this invention. The phenol-biphenylene resin carries no epoxy group. The phenol-biphenylene resin can be prepared with a common method. Commercially available products, such as Phenol Resin MEH-7851 (trade name, Meiwa Kasei Co.), may also be used.

Preferably, the phenol-biphenylene resin is a polymer consisting of the repeating unit represented by following general formula (II)

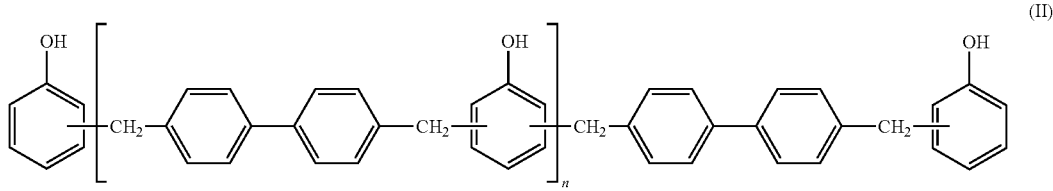

wherein n=0-4, preferably n=0-3, and more preferably n=0-1.

In this invention, the number-average molecular weight of the phenol-biphenylene resin should be in the range of 350-1200, and preferably 370-1000.

When the negative-type photosensitive resin composition of this invention contains a phenol-biphenylene resin, the content of the phenol-biphenylene resin should be in the range of 1-75 weight %, preferably 5-45 weight %, and more preferably 10-40 weight %, calculated based on the total weight of novolac resin, poly(vinylphenol) and phenol-biphenylene resin.

In addition to the novolac resin, poly(vinylphenol), and phenol-biphenylene resin, the negative-type photosensitive resin composition of this invention may also contain other resin binders, which do not carry an epoxy group. The resin binder can be, for example, a homopolymer or copolymer of N-hydroxyphenylmaleimide.

In the negative-type photosensitive resin composition of this invention, the weight ratio of the epoxy compound to the total weight of novolac resin, poly(vinylphenol), phenol-biphenylene resin if present, and other resin binder if present [weight of epoxy compound/(weight of novolac resin+weight of poly(vinylphenol)+weight of phenol-biphenylene resin, if present, +weight of other resin binder if present)] should be in the range of 0.5:1-2:1, and preferably 0.7:1-1.6:1.

The negative-type photosensitive resin composition of this invention contains a photo-acid-generating agent capable of generating an acid under irradiation with an active radiation beam. Any commonly used photo-acid-generating agent is suitable for this purpose. Preferably, the photo-acid-generating agent is an onium salt. More preferably, the photo-acid-generating agent is an onium salt carrying a weak nucleophilic cation. The cation can be a 2-7-valent metallic element or a nonmetallic element, such as Sb, Sn, Fe, Bi, Al, Ga, In, Ti, Zr, Sc, D, Cr, Hf, and Cu as well as a halogen complex cation of B, P, and As. Good examples of the onium salt are diaryl diazonium salts, onium salts of group Va, group Vb, group Ia, group Ib, and group I elements, such as halonium salts, including aromatic iodonium salts and iodoxonium salts, quaternary ammonium, phosphonium, and arsonium salts, aromatic sulfonium salts, sulfoxonium salts, and selenonium salts. The photo-acid-generating agent or the onium salt can be prepared with a common method. Commercially available products, such as triallylsulfonium hexafluorophosphate, may also be used. When the photo-acid-generating agent is an iodonium salt, it is preferable to use a salt formed by aryliodoso tosylate and aryl ketone with the method described in U.S. Pat. No. 4,683,317.

The photo-acid-generating agent may also be a nonionic organic compound. Preferably the nonionic organic compound is a halogenated nonionic organic compound, such as 1,1-bis(p-chlorophenyl)-2,2,2-trichloroethane (DDT), 1,1-bis-p-methoxyphenyl)-2,2,2-trichloroethane) (trade name: Methoxychlor), 1,2, 5,6,9,10-hexabromocyclododecane, 1,10-dibromodecane, 1,1-bis-p-chlorophenyl)-2,2-dichloroethane, 4,4'-dichloro-2-(trichloromethyl)benzhydrol, 1,1-bis (chlorophenyl)-2,2,2-trichloroethanol (trade name: Kelthane), hexachlorodimethylsulfone, 2-chloro-6-(trichloromethyl)pyridine, O,O-diethyl-O-(3,5,6-trichloro-2-pyridyl)phosphorothioate (trade name: Dursban), 1,2,3,4, 5,6-hexachlorocyclohexane, N-1,1-bis-p-chlorophenyl)-2,2, 2-trichloroethylacetamide, tirs(2,3-dibromopropyl) isocyanurate, 2,2-bis(p-chlorophenyl)-1,1-dichloroethylene, as well as the isomers, and analogs of these compounds. However, among these compounds, it is preferable to use tris(2,3-dibromopropyl) isocyanurate. The photo-acid-generating agents suitable for the purpose of this invention are also described in European Patent No. 0 232 972.

The negative-type photosensitive resin composition of this invention should contain a suitable amount of the photo-acid-generating agent sufficient for the development of the coating film formed by the resin composition after exposure under the active radiation beam or after exposure and post-exposure baking treatment.

In addition to the components described above, the negative-type photosensitive resin composition of this invention may also contain a suitable amount of a crosslinking agent, if necessary. Any commonly used crosslinking agent is suitable for this purpose. Good examples of the crosslinking agent are amine-based compounds, such as monomer, oligomer, and polymer of melamine, various resin materials, such as melamine-formaldehyde resin, benzoguanamine-formaldehyde resin, urea-formaldehyde resin, and glycoluril-formaldehyde resin, as well as a combination of these agents. However, it is preferable to use an amine-based crosslinking agent, such as Cymel 300, 301, 303, 350, 370, 380, 1116, and 1130 (trade name for melamine resin manufactured by American Cyanamid Company, Wayne, N.J.), Cymel 1123 and 1125 (trade name for benzoguanamine resin), Cymel 1170, 1171, and 1172 (trade name for glycoluril resin), and Beetle 60, 65, and 80 (trade name for urea resin). Other similar amine-based compounds are also commercially available from different vendors.

Among the amine-based crosslinking agents described above, it is preferable to use a melamine resin, and a melamine-formaldehyde resin which is a reaction product of melamine and formaldehyde is more preferable. The resin material is usually an ether, such as trialkylolmelamine or hexaalkylolmelamine. The alkyl group may contain 1-8 or more carbon atoms. However, the methyl group is preferable. Depending on the reaction conditions and on the concentration of formaldehyde used, the methyl ether molecules may react with each other to form complicated units.

The negative-type photosensitive resin composition of this invention may contain a photosensitizer. The photosensitizer is added at a sufficient quantity to increase the sensitivity at a desirable wavelength range. Good examples of the photosensitizer are 2-ethyl-9,10-dimethoxyanthracene, 9,10-dichloroanthracene, 9,10-phenylanthracene, 1-chloroanthracene, 2-methylanthracene, 9-methylanthracene, 2-t-butylanthracene, anthracene, 1,2-benzoanthracene, 1,2,3,4-dibenzoanthracene, 1,2,5,6-dibenzoanthracene, 1,2,7,8-dibenzoanthracene, and 9,10-dimethoxydimethylanthracene. However, it is preferable to use 2-ethyl-9, 10-dimethoxyanthracene, N-methylphenothiazine, and isopropylthioxanthone.

The negative-type photosensitive resin composition of this invention may also contain other additives, including dyes, wetting agents, flame retardants, leveling agents, silane coupling agents. When the resin composition of this invention is used on a silicon substrate, it is preferable to use a silane coupling agent to improve the affinity of the resin film to the silicon substrate. The concentrations of the additives used in the negative-type photosensitive resin composition of this invention should be determined depending on the nature of the additive, the application of the resin composition, the type of the substrate, and the like. There is no special limitation on the concentrations of the additives.

The negative-type photosensitive resin composition of this invention may contain a filler. The filler can be, for example, an inorganic filler, such as fumed silica, alumina microparticles, and an organic filler, such as acrylate microparticles with a core-shell structure. The use of a filler may affect the coating performance of the negative-type photosensitive resin composition and may increase thixotropy of the negative-type photosensitive resin composition. As a result, it will be easy to form a thick film. On the other hand, it is preferable to form a coating film with a thickness of 1-2 µm without using a filler. Moreover, the inorganic filler may serve as an etching mask in the plasma etching step. Therefore, if the plasma etching step is used to remove the photosensitive resin completely, the negative-type photosensitive resin composition should not contain an inorganic filler.

In this invention, the positive-type photosensitive resin composition contains, for example, a photosensitive resin, an epoxy compound, and a photopolymerization initiator. Good examples of the positive-type photosensitive resin composition are the resin compositions described in Japanese Kokai Hei 08-006246. The photosensitive polyimide resin composition containing photosensitive polyimide or a combination of photosensitive polyimide and photopolymerization initiator described in Japanese Kokai Hei 05-289334 and 09-100350 may also be used as the positive-type photosensitive resin composition of this invention.

Moreover, the photosensitive resin composition of this invention may also contain a suitable solvent capable of dissolving the components described above. Certain solvents may cause decomposition of the catalyst precursor, causing precipitation of metal powder. Therefore, the solvent used in the photosensitive resin composition of this invention should be able to dissolve the components present in the photosensitive resin composition, such as phenol novolac resin, epoxy resin, photo-acid generating agent, hardening agent, and catalyst precursor, and do not cause decomposition of the catalyst precursor and precipitation of metal powder. Good examples of the solvent are propylene glycol monomethyl ether acetate (PMA), dipropylene glycol monomethyl ether acetate, ethyl lactate, butyl acetate, di(n-butyl) phthalate, isophorone, 4-hydroxy-4-methylpentanone, acetone, methyl ethyl ketone, 1-methoxy-2-propanol, ethylene glycol monoethyl ether, 2-(2-butoxyethoxy)ethanol, and 1,3-dimethyl-2-imidazolidinone. Particularly, esters, such as ethyl lactate, butyl acetate, and di(n-butyl) phthalate, are effective inhibitors for the decomposition of the catalyst precursor.

One embodiment of this invention is a photosensitive resin composition, which includes a catalyst precursor selected from palladium neooctanoate, palladium neodecanoate, and palladium neononanoate, a photosensitizer, a resin selected from poly(vinylphenol), novolac resin and a combination of the two resins, an epoxy compound.

Another embodiment of this invention is a method for the formation of a resin pattern with a metal-deposition catalytic activity suitable for electroless metal plating, which uses the following procedure. Thus, the photosensitive resin composition described above is first coated on a substrate and then exposed and developed to form a resist pattern. Next, a conversion treatment is conducted to convert the catalyst precursor present in the resin pattern to a catalyst, followed by activation of the resin pattern surface.

In the method of this invention, there is no special limitation on the substrate, as along as the substrate is suitable for the formation of a resist pattern with a metal-deposition catalytic activity suitable for electroless metal plating. The substrate may have any shape and can be made of any material. Good examples of the material for the substrate are resin, ceramic, metal, etc. The resin substrate can be, for example, printed circuit board, and semiconductor package. The ceramic substrate can be, for example, a semiconductor package. The metal substrate can be, for example, copper film, and silicon wafer. The glass substrate can be, for example, display device, such as LCD, and FPD. The substrate can be made of a combination of insulating material and conducting material, for example, a conducting metal pattern formed on a resin plate, or a combination of different conducting materials, for example, a copper sputtering film coated on a silicon wafer.

The resin material used for the substrate can be, for example, a thermoplastic resin, including a polyethylene resin such as high density polyethylene, medium density polyethylene, branched low density polyethylene, straight-chain low density polyethylene, and ultra-high molecular weight polyethylene, a polyolefin resin such as polyethylene, polybutadiene, polybutene, polybutylene, and polystyrene, a halogen-containing resin such as polyvinyl chloride, polyvinylidene chloride, vinyl chloride/vinylidene chloride copolymer, chlorinated polyethylene, chlorinated polypropylene, and polytetrafluoroethylene, AS resin, ABS resin, MBS resin, polyvinyl alcohol, a polyacrylic acid ester resin such as poly(methyl acrylate), a polymethacrylic acid ester resin such as poly(methyl methacrylate), methyl methacrylate/styrene copolymer, maleic anhydride/styrene copolymer, polyvinyl acetate, a cellulose resin such as cellulose propionate, and cellulose acetate, epoxy resin, polyimide, a polyamide resin such as nylon, polyamide imide, polyarylate, polyether imide, polyether ether ketone, polyethylene oxide, a polyester resin such as PET, polycarbonate, polysulfone, polyvinyl ether, polyvinyl butyral, a polyphenylene ether resin such as polyphenylene oxide, polyphenylene sulfide, polybutylene terephthalate, polymethylpentene, polyacetal, a copolymer resin such as vinyl chloride/vinyl acetate copolymer, ethylene/vinyl acetate copolymer, and ethylene/vinyl chloride copolymer, or a mixture of these resins, as well as a thermosetting resin, including epoxy resin, xylene resin, guanamine resin, diallyl phthalate resin, vinyl ester resin, phenol resin, unsaturated polyester resin, furan resin, polyimide, polyurethane, maleic acid resin, melamine resin, and urea resin, or a mixture of these resins. However, preferably, the substrate is made from epoxy resin, polyimide resin, vinyl resin, phenol resin, nylon, polyphenylene ether, polypropylene, fluoro resin, and ABS resin. More preferably, the substrate is made from epoxy resin, polyimide resin, polyphenylene ether, fluoro resin, and ABS resin. Most preferably, the substrate is made from epoxy resin and polyimide resin. Moreover, the substrate can be made from a single resin material or a mixture of multiple resin materials and can also be a composite formed by coating or laminating a resin material onto another resin material. The substrate can also be a composite formed by a resin material reinforced by other materials, such as glass fiber or formed by coating a resin material onto other base materials, such as ceramic, glass, and silicon.

The ceramic material used for the substrate can be, for example, an oxide ceramic, such as alumina ($Al_2O_3$), steatite (MgO—$SiO_2$), forsterite (2MgO—$SiO_2$), mullite ($3Al_2O_3$-$2SiO_2$), magnesia (MgO), spinel (MgO—$Al_2O_3$), and beryllia (BeO), a non-oxide ceramic such as aluminum nitride, silicon carbide, as well as a low-temperature sintered ceramic such as glass ceramic.

In the method of this invention, the photosensitive resin composition of this invention can be coated on a substrate with any common method, such as spin coating. After having been coated on the substrate, the photosensitive resin composition of this invention is dried by removing the solvent to form a coating film. If necessary, a soft baking treatment can be carried out before exposure.

Next, the coating film formed by the photosensitive resin composition of this invention is exposed and developed to form a resin pattern on the substrate. The exposure and development treatment can be carried out with a common method suitable for the photosensitive resin composition of this invention. After the exposure treatment, a post-exposure baking treatment can be carried out, if necessary.

In the method of this invention, a conversion treatment is carried out to convert the catalyst precursor present in the resin pattern to the catalyst. Here, the conversion treatment is a treatment for converting the catalyst precursor to the catalyst, while the catalyst is a catalyst with a function of catalyzing the metal deposition in an electroless metal plating process. In this invention, there is no special limitation on the conversion treatment, as long as the catalyst precursor present in the resin pattern can be converted to the catalyst through the treatment. However, it is preferable to use a conversion treatment, which is carried out by heating the resin pattern to a temperature equal to or higher than the decomposition temperature of the catalyst precursor to form the corresponding catalyst. In the heating treatment, the catalyst precursor present in the resin pattern is decomposed, so that the catalyst metal element is converted to a substance with a metal-deposition catalytic activity suitable for electroless metal plating. There is no special limitation on the reaction conditions used for the heating treatment, as long as the heating temperature and heating time are suitable to generate sufficient catalytic activity of metal deposition in the subsequent electroless metal plating process. For example, when the hardening temperature for the thermosetting resin used in the resin composition is lower than the decomposition temperature of the catalyst precursor, the resin hardening treatment is first carried out and, then, the conversion treatment of the catalyst precursor is carried out at a temperature higher than the decomposition temperature of the catalyst precursor. On the other hand, however, when the hardening temperature for the thermosetting resin is higher than the decomposition temperature of the catalyst precursor, the resin hardening treatment and the conversion treatment of the catalyst precursor can be carried out simultaneously.

In the method of this invention, the conversion treatment of the catalyst precursor present in the resin pattern to form the catalyst is followed by the activation treatment of the surface of the resin pattern. Here, the activation treatment is a treatment used to improve the metal deposition catalytic activity of the resin pattern when the resin pattern is subjected to the electroless metal plating process after the conversion treatment. Since the conversion treatment alone is unable to provide a final resin pattern with a sufficient metal-deposition catalytic activity, it is necessary to use the activation treatment to achieve a sufficient metal-deposition catalytic activity. In other words, in the method of this invention, the catalyst precursor present in the resin pattern is first converted to the catalyst and then the surface of the resin pattern is activated to form a resin pattern with a sufficient metal-deposition catalytic activity suitable for electroless metal plating. Moreover, the activation treatment of the resin pattern surface can be carried out after the conversion treatment or the activation treatment and the conversion treatment can be carried out simultaneously.

In this invention, there is no special limitation on the activation treatment, as long as the activation treatment is able to improve the metal-deposition catalytic activity of the resin pattern surface after the conversion treatment. Preferably, the activation treatment is a treatment capable of exposing the catalyst on the surface of the resin pattern. Thus, by using the activation treatment, the catalyst present in the resin pattern can be exposed on the surface of the resin pattern. As a result, the metal-deposition catalytic activity of the resin pattern surface can be improved. In addition, the activation treatment also provides a rough surface on the resin pattern, so that the attachment of the metal film formed in the subsequent electroless metal plating process on the resin surface can be improved.

As the activation treatment, the catalyst-exposing treatment can be carried out by physically or chemically polishing the surface of the resin pattern. For example, drying etching such as oxygen plasma etching, UV ozone etching, and ozone ashing, or wet etching such as sodium permanganate etching, as well as physical polishing such as weight blast, can be used or a combination of these treatments may also be used. There is no special limitation on the thickness of the surface layer of the resin pattern removed by the catalyst-exposure treatment or by polishing. However, the thickness of the surface layer removed should be in the range of 0.1-2.0 μm, and preferably 0.3-0.5 μm.

On the other hand, it is possible to expose the active catalyst on the surface without polishing the surface. For example, sintering in a nitrogen atmosphere or in a vacuum oven to prevent the oxidation of the catalyst. The sintering may also be carried out in a reducing atmosphere, such as a hydrogen atmosphere. Moreover, the catalyst which has lost its catalytic activity can be activated with an activation treatment using a reducing agent such as formalin as well as an aqueous solution of sodium borohydride, or dimethylamine borane.

An inorganic filler with a function of exposing the catalyst may also be added to the resin composition. There is no special limitation on the inorganic filler used for this purpose. However, it is preferable to use silica, especially Easmat OK-607 or Easmat OK-412 (trade name of silica products manufactured by Degussa Co.). By using the silica product, the inorganic filler and the activated catalyst will be exposed simultaneously on the surface of the resin pattern after the resin is hardened. As a result, the activated catalyst can be exposed on the surface of the resin pattern without using a catalyst-exposing treatment.

Another embodiment of this invention is a method for the formation of a resin pattern with a metal-deposition catalytic activity suitable for electroless metal plating, which uses the following procedure. First, an acid-containing primer resin pattern is formed and then, the photosensitive resin composition of this invention is applied on the substrate coated with the acid-containing primer resin pattern. Next, the photosensitive resin composition of this invention is heated for a soft baking treatment to form a resin pattern. In other words, as one embodiment of this invention, the photosensitive resin composition of this invention is applied on the substrate coated with an acid-containing primer resin pattern and then heated for a soft baking treatment to form a resin pattern. Next, a conversion treatment is carried out to convert the catalyst precursor to the catalyst, followed by an activation treatment for the surface of the resin patter to form a resin pattern with a metal-deposition catalytic activity suitable for electroless metal plating.

In this embodiment of this invention, the soft baking treatment is used to remove the solvent present in the resin composition coated on the substrate and not for the purpose of crosslinking and hardening of the resin material present in the resin composition. Therefore, the soft baking treatment is carried out at a relatively low temperature of 60-130° C.

While not wishing to be bound by theory, it is believed that by using this method, the acid present in the primer resin pattern coated on the substrate will migrate to the upper layer of the photosensitive resin composition containing the catalyst precursor during the soft baking treatment. Therefore, a resin pattern of the photosensitive resin composition can be formed without using the exposure treatment. In this case, the upper layer of the resin pattern containing the catalyst precursor will follow and cover the lower primer resin pattern. In the method of this invention, there is no special limitation on the acid content in the primer resin pattern, as long as the acid content is sufficient for the formation of the resin pattern of the photosensitive resin composition containing the catalyst precursor. This method has the advantage of having a short manufacturing process and low production cost. In addition, the method does not require a highly precise photolithographic technology for the photomask alignment during the exposure treatment of the photosensitive resin composition containing the catalyst precursor. The acid-containing primer resin pattern can be formed with any common material with any common method. However, it is preferable to use a photosensitive resin composition containing a photo-acid-generating agent, which is first coated on the substrate and then exposed and developed to form the acid-containing primer resin pattern.

Another embodiment of this invention is a method for the formation of a metal-resin composite, which uses an electroless metal plating treatment for the resin pattern with a metal-deposition catalytic activity suitable for electroless metal plating.

In the method of this invention, the resin pattern described above is treated with electroless metal plating. The catalyst metal element exposed on the surface of the resin pattern is able to catalyze the metal deposition during the electroless metal plating treatment to form a metal film on the resin pattern.

As described above, the method for the electroless metal plating treatment can be any common method for electroless metal plating and should be selected based on the type of the catalytic metal element exposed on the resin surface. The electroless metal plating treatment can be, for example, electroless copper plating, electroless nickel plating, electroless nickel alloy plating, electroless gold plating, electroless tin plating, electroless zinc plating, electroless silver plating, and electroless cobalt plating, as well as electroless plating of an alloy formed by metals selected from copper, nickel, gold, tin, zinc, silver, and cobalt. Moreover, there is no special limitation on the plating bath and plating conditions used for the electroless metal plating treatment.

The metal-resin composite of this invention can be formed with the method described above. The metal-resin composite can be, for example, semiconductor, semiconductor package, printed circuit board, LCD, FPD, organic EL display, and EMI shielding plastic composite.

The metal-resin composite of this invention can be further treated with electroless metal plating and/or electrolytic metal plating, so that vias, trenches, and the like, formed in the resin pattern can be filled.

The photosensitive resin composition of this invention itself may have a reduced insulating reliability, since a metallic element is introduced into the resin. When the photosensitive resin composition of this invention is coated on an insulating resin material to form wires with the semiadditive method, the undesired part of the thin conductive layer is removed through an etching process using a solution containing sulfuric acid, hydrogen peroxide, and the like. However, the photosensitive resin composition of this invention may remain on the insulating resin material and the remaining resin composition may affect the insulating reliability between wires. Therefore, the remaining resin composition must be removed. However, since the remaining resin composition can be removed by the dry etching treatment conducted to form the etching mask for copper or nickel wires, this invention is also very useful for the formation of wires and the plating process for via and trench.

In the following, this invention is explained in more detail with practical examples. However, these practical examples should not be considered as limitations of this invention.

PRACTICAL EXAMPLES

In the practical examples, the following photosensitive resins were used.

Poly(p-vinylphenol) (Marcalinker M S4P, Maruzen Sekiyu Co.): 17.8 weight units

Phenol-biphenylene resin (softening point: 79° C.; OH eq: 207 g/eq) (Phenol Resin MEH-7851, Meiwa Kasei Co.); 5.9 weight units Epoxy resin: Bisphenol A type epoxy resin (Epikote 828, Japan Epoxy Resin Co., Ltd.);

24.5 weight units

Crosslinking agent: Hexamethoxymethylated melamine (Mitsui Saitech Co., Ltd.); 24.5 weight units Photo-acid-generating agent: Triallylsulfonium hexafluorophosphate: 2.0 weight units Photosensitizer: 2-Ethyl-9,10-dimethoxyanthracene: 0.4 weight units Silane coupling agent: γ-glycidoxypropyltrimethylsilane (Torei-Dow Chemical Silane Co., Ltd.): 1.2 weight units PMA: 1-Methoxy-2-propyl acetate: 38.8 weight units In the practical examples, the metal-resin composite was formed following steps 1-10, unless noted otherwise.

Step 1: The photosensitive resin composition, containing the photosensitive resin, catalyst precursor, and propylene glycol monomethyl ether acetate (PMA) as a viscosity-adjusting agent, was prepared according to the ratios listed in the practical examples and comparative examples and then coated using a spin coater on a glass substrate to form a coating film with a thickness of 2 μm after drying.

Step 2: The substrate coated with the photosensitive resin composition of this invention is heated in an oven at 75° C. for 30 minutes.

Step 3: The substrate is covered with a quartz mask printed with a chromium wire pattern and irradiated with UV light generated by a high-pressure mercury lamp (lines i, g, and h) at a total exposure of 750 mJ at line i.

Step 4: The exposed substrate is heated in an oven at 75° C. for 40 minutes for post-exposure baking.

Step 5: Development is carried out by dipping the substrate in a developing solution containing 2.38 weight % of tetramethylammonium hydroxide (TMAH) at 23° C. for 2 minutes. The formation of the resin pattern is confirmed by visual inspection.

Step 6: The substrate carrying the resin pattern is heated in an oven at 130° C. for 30 minutes for pre-hardening.

Step 7: The substrate carrying the resin pattern is heated at 175° C. for 3 hours for hardening.

Step 8: The substrate carrying the resin pattern is heated at 200° C. for 10 minutes for decomposition of the catalyst precursor.

Step 9: Plasma etching is carried out on the surface of the resin pattern using oxygen plasma (RIE200L, Samco International Research Institute). A surface layer with a thickness of 0.3-0.5 μm is removed during the etching treatment.

Step 10: The substrate carrying the resin pattern is dipped in an electroless nickel alloy plating bath (RONAMAX SMT-115, Shipley Company L.L.C.) at 85° C. for 1 minute to form a nickel film on the resin pattern.

Practical Examples 1-9

In Practical Examples 1-9, the metal-resin composite was prepared according to the compositions listed in Table 1. In Practical Examples 1, 2, and 3, Step 9 was carried out according to the procedure described above. In Practical Examples 4-6 (comparative examples), Step 9 was omitted and Step 10 was carried out after Step 8. In Practical Examples 7-9, Step 9 was replaced with a physical polishing treatment of the resin pattern surface using a piece of nonwoven fabric (trade name: Scotchbright, 3M Co.). A surface layer with a thickness of 0.5 μm was removed during the etching treatment. In Practical Examples 1-9, a dark red oil of palladium resinate, containing palladium neooctanoate with 8 carbon atoms and having a decomposition temperature of 200.1° C., was used as the catalyst precursor. The palladium content in the catalyst precursor was 23 weight %.

TABLE 1

| Practical Example | Photosensitive resin weight | Catalyst precursor weight | PMA weight | Step 9 | Ni deposition |
|---|---|---|---|---|---|
| 1 | 24.5 g | 0.15 g | 5 g | Yes | No |
| 2 | 24.5 g | 0.25 g | 5 g | Yes | Yes |
| 3 | 24.5 g | 0.50 g | 5 g | Yes | Yes |

TABLE 1-continued

| Practical Example | Photosensitive resin weight | Catalyst precursor weight | PMA weight | Step 9 | Ni deposition |
|---|---|---|---|---|---|
| 4 | 24.5 g | 0.15 g | 5 g | No | No |
| 5 | 24.5 g | 0.25 g | 5 g | No | No |
| 6 | 24.5 g | 0.50 g | 5 g | No | No |
| 7 | 24.5 g | 0.15 g | 5 g | Physical polishing | No |
| 8 | 24.5 g | 0.25 g | 5 g | Physical polishing | Yes |
| 9 | 24.5 g | 0.50 g | 5 g | Physical polishing | Yes |

In Practical Examples 2, 3, 8, and 9, nickel precipitation on the resin pattern was observed, suggesting the effectiveness of the method of this invention in the formation of metal-resin composite.

On the other hand, however, the results obtained in Practical Example 4-6 (comparative examples) show that no nickel precipitation on the resin pattern was observed, when the plasma etching step, Step 9, was omitted. Therefore, the activation treatment or catalyst-exposing treatment of the resin pattern, such as surface etching is necessary.

Moreover, nickel precipitation on the resin pattern was also observed when the plasma etching treatment was replaced by a wet etching treatment using a sodium permanganate solution or a physical polishing treatment using weight blast (data not shown in Practical Examples 1-9). These results suggest the catalyst exposing treatment of the resin pattern surface is necessary for the method of this invention.

In Practical Examples 1 and 7, no nickel precipitation on the resin pattern was observed, although Step 9 was carried out. The result may be due to the low content of the catalyst precursor in the resin composition.

Practical Examples 10-18

In Practical Examples 10-18, nickel deposition was studied using various catalyst precursors shown in Table 2. The temperature of Step 8 listed in the table was the decomposition temperature of the catalyst precursor.

The following catalyst precursors were used in the practical examples. Practical Example 11: palladium resinate Pd-C10 (brown oil, decomposition temperature 210° C., Degussa Co.); Practical Example 12: palladium resinate Pd-C8 (brown oil containing palladium neooctanoate, decomposition temperature 200° C., Degussa Co.); and Practical Example 13: palladium resinate MR-4602P (brown oil containing palladium neodecanoate, decomposition temperature 210° C., Heraeus Co.). In other practical examples, straight-chain alkyl carboxylic acid metal salts were used as the catalyst precursor. The metal elements, the number of the carbon atoms in the straight-chain alkyl carboxylic acid, and the related properties of the metal salts are shown in Table 2.

TABLE 2

| Practical Example | Photosensitive resin weight | Catalyst precursor | | | | PMA weight | Step 8 | Ni deposition |
|---|---|---|---|---|---|---|---|---|
| | | Metal | No. of carbon atom. | Amount | Properties | | | |
| 10 | 24.5 g | Pd | 8 | 0.25 g | Dark red oil, containing 23 weight % Pd | 5 g | 200° C., 10 min | Yes |

TABLE 2-continued

| Practical Example | Photosensitive resin weight | Catalyst precursor | | | | PMA weight | Step 8 | Ni deposition |
|---|---|---|---|---|---|---|---|---|
| | | Metal | No. of carbon atom. | Amount | Properties | | | |
| 11 | 24.5 g | Pd | 10 | 0.25 g | Brown oil, containing 23 weight % Pd | 5 g | 210° C., 10 min | Yes |
| 12 | 24.5 g | Pd | 8 | 0.25 g | Dark red oil, containing 27 weight % Pd | 5 g | 200° C., 10 min | Yes |
| 13 | 24.5 g | Pd | 10 | 0.25 g | Brown oil, containing 25 weight % Pd | 5 g | 210° C., 10 min | Yes |
| 14 | 24.5 g | Ag | 4 | 0.25 g | Brown crystals, containing 51 weight % Ag | 5 g | 180° C., 10 min | Yes |
| 15 | 24.5 g | Ag | 6 | 0.25 g | White crystals, containing 48 weight % Ag | 5 g | 240° C., 10 min | Yes |
| 16 | 24.5 g | Ag | 7 | 0.25 g | White crystals, containing 46 weight % Ag | 5 g | 240° C., 10 min | Yes |
| 17 | 24.5 g | Ag | 10 | 0.25 g | White crystals, containing 39 weight % Ag | 5 g | 230° C., 10 min | Yes |
| 18 | 24.5 g | Pd | 16 | 0.25 g | Brown crystals, containing 19 weight % Pd | 5 g | 250° C., 10 min | Yes |

As shown in the table, even when different catalyst precursors were used, nickel deposition was observed and the purpose of this invention was achieved, as long as the catalyst precursor was heated at its decomposition temperature.

Practical Examples 19-23

In Practical Examples 19-23, the metal-resin composite prepared with the method of this invention was compared with the metal-resin composite prepared through the current electroless metal plating process and sputtering process for the attachment strength of the conductive thin layer. The attachment strength was evaluated according to the method listed in JIS-C6481 using a universal testing machine to measure the peel strength. The photosensitive resin composition used in the practical examples contained 24.5 g of the photosensitive resin, 5 g of PMA, and 0.25 g of the catalyst precursor.

In Practical Example 19, a nickel thin layer was formed on the resin pattern through Steps 1-10. Then, electrolytic copper plating was carried out to form a copper plating film with a thickness of 20 μm on the nickel thin layer. In Practical Example 19, palladium neooctanoate (MR-4602P, brown oil, decomposition temperature: 210° C., palladium content: 25 weight %, palladium resinate manufactured by Heraeus Co), 0.25 g, was used as the catalyst precursor.

In Practical Example 20 (comparative example), as a current process, Steps 1-8 were carried out using a photosensitive resin composition containing no catalyst precursor. In Step 9, plasma etching (1 μm) was carried out, followed by the electroless nickel plating treatment, including conditioning, catalyst conversion, catalyst exposure, and electroless nickel plating, to form a metal-resin composite. Next, a copper plating film with a thickness of 20 μm was formed on the nickel thin layer with the same method as in Practical Example 19.

In Practical Example 21 (comparative example), instead of electroless nickel plating, electroless copper plating was carried out and then, a copper plating film with a thickness of 20 μm was formed with the same method as in Practical Example 20.

In Practical Example 22 (comparative example), Steps 1-8 were carried out. In Step 9, plasma etching (1 μm) was carried out, followed by sputtering to form a Ti layer with a thickness of 500 Å and then a Cu layer with a thickness of 3000 Å.

In Practical Example 23 (reference example), except for using Cr sputtering to replace Ti sputtering, the process was carried out with the same method as in Practical Example 22.

TABLE 3

| Practical example | Use of catalyst precursor | Metal coating | Peel strength kN/m |
|---|---|---|---|
| 19 | Yes | Electroless Ni plating | 0.290 |
| 20 | No | Electroless Ni plating | 0.050 |
| 21 | No | Electroless Cu plating | 0.050 |
| 22 | No | Ti/Cu sputtering | 0.050 |
| 23 | No | Cr/Cu sputtering | 0.292 |

The metal-resin composite formed by the method of this invention (Practical Example 19) has a high adhesive strength of the metal film on the resin material, which is comparable to that of the metal-resin composite formed with the process using Cr/Cu sputtering (Practical Example 23), but higher than that of the metal-resin composite formed with the other methods (Practical Examples 22).

Practical Example 24

In Practical Example 24, the metal-resin composite was formed with the same method as in Practical Example 19, except for changing the plasma etching time in Step 9 from 2.5 minutes to 10 minutes. However, no nickel deposition was observed in Practical Example 24 with long plasma etching time. The result may suggest that the photosensitive resin composition containing a catalyst precursor may be completely removed by the drying etching treatment.

Practical Examples 25 and 26

Figure 2:
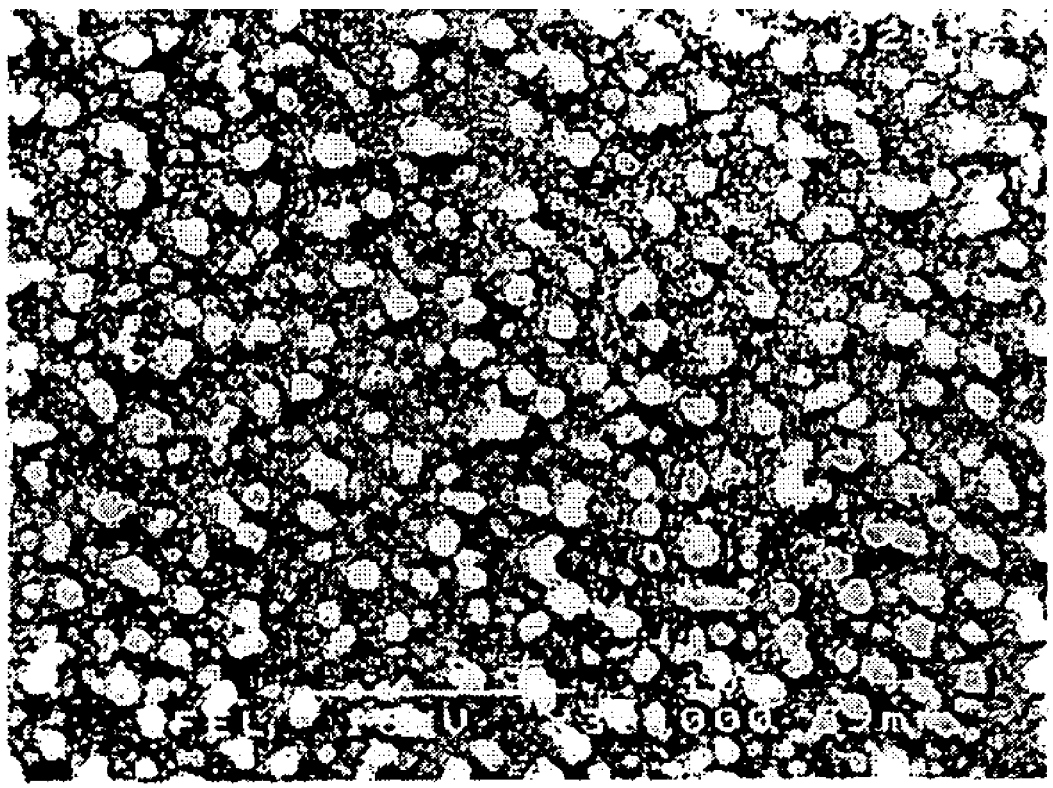
FIG. 2.

In Practical Examples 25 and 26 (comparative example), SEM observation was carried out for the surface generated through the 2.5-minute plasma etching treatment in Step 9. FIGS. 1 and 2 show the SEM pictures, respectively. In Practical Example 25, a palladium-containing catalyst precursor was introduced into the photosensitive resin composition. After the sintering treatment, plasma etching was carried out. As a result, a surface with high protrusions and deep grooves was obtained compared to the surface generated in Practical Example 26 using a photosensitive resin composition containing no catalyst precursor. The result can be explained by that the palladium core formed in the resin may act as an etching mask against oxygen plasma with a high anisotropy, so that exposure of palladium core and selective etching of resin material progress to form the unique uneven surface. This uneven surface will improve the attachment of the coating layer on the resin material formed in the subsequent electroless metal-plating step.

Practical Examples 27-46

In Practical Examples 27-46, stability of the catalyst precursor in various solvents was studied. As shown in Table 4, a certain amount of the catalyst precursor was mixed with a solvent under stirring and set aside at 23° C. for a certain period of time. Then, visual inspection was carried out to check the formation of any precipitation. In Practical Examples 45 and 46, the stability of the catalyst precursor was evaluated in the presence of a decomposition inhibitor, including an epoxy resin (Bisphenol A type epoxy resin, Epikote 828, Japan Epoxy Resin Co., Ltd.) and a silane coupling agent (γ-glycidoxypropyltrimethylsilane, Torei-Dow Chemical Silane Co., Ltd.). In Practical Examples 27-46, palladium resinate MR-4602P (brown oil containing palladium neodecanoate, decomposition temperature 210° C., palladium content 25 weight %, Heraeus Co.) was used as the catalyst precursor. The results obtained are shown in Table 4.

as ethyl lactate, and butyl acetate, are particularly effective as the solvent for the catalyst precursor. As the decomposition inhibitor, epoxy resin and silane coupling agent are effective.

Moreover, the precipitation was also suppressed at a high concentration of the catalyst precursor in the solvent. These results, including the inhibitory effect of epoxy resin and silane coupling agent as well as the concentration effect of the catalyst precursor, may be due to the improved wetting effect or miscibility of the solvent with the catalyst precursor.

Practical Examples 47-50

In Practical Examples 47-50, a photosensitive resin composition containing no catalyst precursor was first coated on a glass substrate as a primer resin to form a resin pattern. Then, a photosensitive resin composition containing 0.25 g of the catalyst precursor, 24.5 g of the photosensitive resin, and 5 g of PMA were coated on the glass substrate carrying the primer resin pattern. The resin pattern containing no catalyst precursor was formed with the same procedure as in Step 1-Step 5 described above, except that the substrate was coated in Step 1 with the resin composition to form a coating film with a thickness of 10 μm after drying. The coating procedure for the photosensitive resin composition containing the catalyst precursor was the same as in Step 1 and Step 2 described above. In Practical Examples 47-50, palladium resinate MR-4602P (brown oil containing palladium neodecanoate,

TABLE 4

| Practical Example | Solvent name | Amount of solvent used | Amount of catalyst precursor used | Amount of decomposition inhibitor added | Decomposition |
|---|---|---|---|---|---|
| 27 | 2-Phenoxyethanol | 47.5 g | 2.5 g | — | Not soluble |
| 28 | 4-Methyl-1,3-dioxolan-2-one | 47.5 g | 2.5 g | — | Not soluble |
| 29 | Ethylene glycol | 47.5 g | 2.5 g | — | Not soluble |
| 30 | γ-Butyrolactone | 47.5 g | 2.5 g | — | Not soluble |
| 31 | 2-Methyoxyethanol | 47.5 g | 2.5 g | — | Not soluble |
| 32 | 1,3-Dimethyl-2-imidazolidinone | 47.5 g | 2.5 g | — | 3 hours |
| 33 | 2-(2-Butoxyethoxy)ethanol | 47.5 g | 2.5 g | — | 2 days |
| 34 | Ethylene glycol monoethyl ether | 47.5 g | 2.5 g | — | 2 days |
| 35 | 1-Methoxy-2-propanol | 47.5 g | 2.5 g | — | 2 days |
| 36 | Methyl ethyl ketone | 47.5 g | 2.5 g | — | 5 days |
| 37 | Acetone | 47.5 g | 2.5 g | — | 5 days |
| 38 | 4-Hydroxy-4-methylpentanone | 47.5 g | 2.5 g | — | 5 days |
| 39 | PMA | 47.5 g | 2.5 g | — | 5 days |
| 40 | Isophorone | 47.5 g | 2.5 g | — | 5 days |
| 41 | Di-n-butyl phthalate | 47.5 g | 2.5 g | — | 30 days or more |
| 42 | Butyl acetate | 47.5 g | 2.5 g | — | 30 days or more |
| 43 | Ethyl lactate | 47.5 g | 2.5 g | — | 30 days or more |
| 44 | Ethyl lactate | 49.75 g | 0.25 g | — | 2 days |
| 45 | Ethyl lactate | 39.75 g | 0.25 g | Epoxy resin, 10 g | 30 days or more |
| 46 | Ethyl lactate | 49.25 g | 0.25 g | Silane coupling agent, 0.5 g | 30 days or more |

In Practical Examples 27-31, the catalyst precursor was not soluble in the solvent. In Practical Example 32, precipitation occurred when the catalyst precursor was mixed with the solvent and set aside for 3 hours. In Practical Examples 33-35 and Practical Example 44, precipitation occurred when the mixture was set aside for 2 days. In Practical Examples 36-40, precipitation occurred when the mixture was set aside for 5 days. In Practical Examples 41-43 and Practical Examples 45-46, no precipitation occurred even when the mixture was set aside for 30 days or more. Therefore, ester solvents, such decomposition temperature 210° C., palladium content 25 weight %, Heraeus Co.) was used as the catalyst precursor.

In Practical Example 47, the photosensitive resin composition containing the catalyst precursor was coated on the glass substrate carrying the primer resin pattern to form a coating film with a thickness of about 2 μm after drying. Then, Step 2 was carried out followed by Steps 5-10 without going through Steps 3 and 4.

In Practical Example 48, in order to increase the acid content in the primer resin coating film, a UV radiation treatment (2000 mJ, line i) was carried out for the entire surface of the primer resin coating film before the photosensitive resin composition containing the catalyst precursor was coated. The remaining procedure was the same as in Practical Example 47.

In Practical Example 49 (comparative example), in order to decrease the acid content in the primer resin coating film, a baking treatment was carried out in an oven at 130° C. for 30 minutes for the primer resin coating film before the photosensitive resin composition containing the catalyst precursor was coated. The remaining procedure was the same as in Practical Example 47. The baking treatment should consume the acid due to the hardening process of the resin.

In Practical Example 50 (comparative example), a baking treatment in an oven at 130° C. for 30 minutes and then a UV radiation treatment (2000 mJ, line i) using the same procedure as in Practical Example 49 were carried out for the primer resin coating film before the photosensitive resin composition containing the catalyst precursor was coated. The remaining procedure was the same as in Practical Example 47. The baking treatment should consume the acid due to the hardening process of the resin.

The results obtained in Practical Examples 47-50 are shown in Table 5.

TABLE 5

| Practical Example | Treatment of primer resin coating film | | Ni deposition |
| --- | --- | --- | --- |
| | Radiation 2000 mJ | Baking 130° C., 30 min | |
| 47 | No | No | Yes |
| 48 | Yes | No | Yes |
| 49 | No | Yes | No |
| 50 | Yes | Yes | No |

In Practical Examples 47 and 48, the photosensitive resin composition containing the catalyst precursor coated on the substrate surface with no primer resin was removed in Step 5. The photosensitive resin composition containing the catalyst precursor remained only on the primer resin pattern. In Step 10, deposition of nickel was observed on the resin pattern.

In Practical Examples 49 (comparative example) and 50 (comparative example), the photosensitive resin composition containing the catalyst precursor was removed in Step 5 regardless of the presence or absence of the primer resin. In Step 10, no deposition of nickel was observed.

In other words, the acid present in the primer resin pattern may diffuse efficiently into the coating film formed by the photosensitive resin composition containing the catalyst precursor due to the soft baking treatment. As a result, resin patterning can be achieved through development even without using the exposure treatment. Moreover, the acid present in the primer resin pattern can also be consumed during the hardening process. Thus, when the primer resin coating film is treated with soft baking before the photosensitive resin composition containing the catalyst precursor is coated, the acid present in the primer resin pattern is consumed. As a result, it becomes difficult to coat the photosensitive resin composition containing the catalyst precursor on the primer resin coating film. Therefore, no deposition of nickel was observed in Practical Examples 49 and 50.

Significance of the Invention

As described above, the photosensitive resin composition of this invention contains, as a catalyst precursor, a catalytic metal element with a metal-deposition catalytic activity suitable for electroless metal plating. By using the photosensitive resin composition of this invention, it is possible to form a conductive film selectively on a resin pattern. Moreover, by using the photosensitive resin composition of this invention, it is possible to form a conducting film pattern without using a patterning process such as etching. As compared to the current process such as sputtering, the method of this invention is able to form a conductive film pattern with high adhesive strength at a low cost. The method of this invention does not require complicated process control and bath management as in the current electroless metal plating process. By using the method of this invention, it is possible to form a conductive film through a stable process without using a pilot line in actual production. Furthermore, as compared to the current semiadditive method and subtractive method, the method of this invention is more effective in the formation of a metal-resin composite with a fine wiring structure.

What is claimed is:

1. A photosensitive resin composition comprising in admixture a photosensitive resin, a solvent and a catalyst precursor, wherein the photosensitive resin comprises an epoxy compound and a resin material selected from polyvinylphenol, novolac resin, and a mixture thereof, and wherein the catalyst precursor is an organic compound containing a catalytic metal element with a metal-deposition catalytic activity suitable for electroless metal plating and being a metal salt of one or more of a straight-chain or branched carboxylic acid chosen from ($C_6$-$C_{14}$) alkyl carboxylic acid, ($C_6$-$C_{14}$) alkenyl carboxylic acid, and ($C_6$-$C_{14}$) alkynyl carboxylic acid.

2. The composition of claim 1 wherein the catalytic metal element is chosen from palladium, silver, platinum, ruthenium, rhodium, and indium.

3. The composition of claim 1 wherein the catalyst precursor is in the range of 0.01-10 weight % calculated based on the weight of the catalytic metal element with respect to a total weight of solid components in the composition.

4. The composition of claim 1 further comprising a phenolbiphenylene resin.

5. The composition of claim 1, wherein the solvent is chosen from esters, isophorone, 4-hydroxy-4-methylpentanone, acetone, methyl ethyl ketone, 1-methoxy-2-propanol, ethylene glycol monoethyl ether, 2-(2-butoxyethoxy)ethanol, and 1,3-dimethyl-2-imidazolidinone.

6. A method for the formation of a resin pattern with a metal-deposition catalytic activity suitable for electroless metal plating, comprising the steps of: coating the photosensitive resin composition of claim 1 on a substrate; exposing and developing the photosensitive resin composition to form a resin pattern; heating the resin pattern at a temperature higher than the decomposition temperature of the catalyst precursor to convert the catalyst precursor present in the resin pattern to a catalyst; and activating the resin pattern surface to expose the catalyst on the surface of the resin pattern.

7. The method of claim 6 wherein the heating step is carried out at a temperature of 170° C. or higher.

8. The method of claim 6, wherein the activating step provides a rough surface on the resin pattern.

9. The method of claim 8, wherein the activating step is chosen from dry etching, wet etching, physical polishing, sintering in a nitrogen atmosphere or in a vacuum oven, and a combination of the foregoing.

10. The method of claim 6 further comprising the step of electrolessly depositing metal on the activated resin pattern surface by contacting the activated resin pattern surface with an electroless metal plating bath.

11. A method for the formation of a resin pattern with a metal-deposition catalytic activity suitable for electroless metal plating, comprising the steps of: coating the photosensitive resin composition of claim 1 on a substrate, the substrate being previously coated with an acid-containing primer resin; heating the photosensitive resin composition to form a resin pattern; heating the resin pattern at a temperature higher than the decomposition temperature of the catalyst precursor to convert the catalyst precursor present in the resin pattern to a catalyst; and activating the resin pattern surface to expose the catalyst on the surface of the resin pattern.

12. The method of claim 11, wherein the step of heating the resin pattern is carried out at a temperature of 170° C. or higher.

13. The method of claim 11, wherein the activating step is chosen from dry etching, wet etching, physical polishing, sintering in a nitrogen atmosphere or in a vacuum oven, and a combination of the foregoing.

14. The method of claim 11 further comprising the step of electrolessly depositing metal on the activated resin pattern surface by contacting the activated resin pattern surface with an electroless metal plating bath.

15. The composition of claim 1 wherein the epoxy compound has the formula:

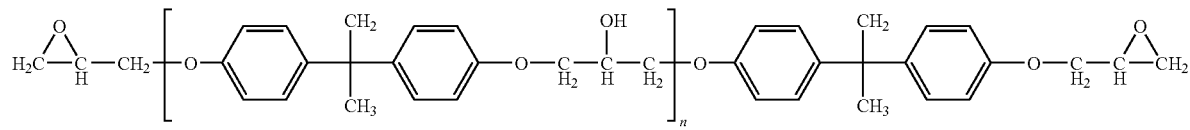

wherein n=0-2.

* * * * *